United States Patent
Ohsawa et al.

(10) Patent No.: US 8,618,828 B2
(45) Date of Patent: Dec. 31, 2013

(54) CONNECTION STRUCTURE OF ELECTRONIC COMPONENT AND WIRED CIRCUIT BOARD, WIRED CIRCUIT BOARD ASSEMBLY, AND METHOD FOR TESTING ELECTRONIC COMPONENT

(75) Inventors: Tetsuya Ohsawa, Osaka (JP); Hitoki Kanagawa, Osaka (JP)

(73) Assignee: Nitto Denko Corporation, Osaka (JP)

( * ) Notice: Subject to any disclaimer, the term of this patent is extended or adjusted under 35 U.S.C. 154(b) by 424 days.

(21) Appl. No.: 12/926,441

(22) Filed: Nov. 18, 2010

(65) Prior Publication Data
US 2011/0128033 A1    Jun. 2, 2011

Related U.S. Application Data

(60) Provisional application No. 61/282,060, filed on Dec. 9, 2009.

(30) Foreign Application Priority Data

Dec. 1, 2009  (JP) ................................ 2009-273693

(51) Int. Cl.
*G01R 31/00*   (2006.01)
(52) U.S. Cl.
USPC ............. 324/763.01; 324/755.01; 324/756.07
(58) Field of Classification Search
None
See application file for complete search history.

(56) References Cited

U.S. PATENT DOCUMENTS

| | | | |
|---|---|---|---|
| 5,737,837 A * | 4/1998 | Inaba | ............................... 29/884 |
| 5,786,962 A * | 7/1998 | Kawazoe | ................... 360/234.5 |
| 2006/0072245 A1 | 4/2006 | Motonishi et al. | |
| 2006/0087769 A1 | 4/2006 | Ohsawa et al. | |

FOREIGN PATENT DOCUMENTS

| JP | 10-55641 A | 2/1998 |
|---|---|---|
| JP | 2005-322377 A | 11/2005 |
| JP | 2006-120288 | 5/2006 |
| JP | 2007-128634 | 5/2007 |

OTHER PUBLICATIONS

Dismissal of Amendment dispatched by JPO on Aug. 13, 2013 in connection with corresponding Japanese Patent Application No. 2009-273693.

* cited by examiner

*Primary Examiner* — Minh N Tang
(74) *Attorney, Agent, or Firm* — Jean C. Edwards; Edwards Neils PLLC

(57) ABSTRACT

In a connection structure of an electronic component and a wired circuit board, the electronic component includes a plurality of external terminals. The wired circuit board includes a metal supporting board, an insulating base layer formed on the metal supporting board, and a conductive pattern formed on the insulating base layer. The conductive pattern includes a plurality of terminal portions for connection with the plurality of external terminals. The electronic component and the wired circuit board are disposed such that the plurality of external terminals and the plurality of terminal portions face each other. The wired circuit board is bent such that the conductive pattern is warped, and by the reaction force of the warping, the terminal portions and the external terminals are abutted, and the electronic component and the wired circuit board are electrically connected.

4 Claims, 9 Drawing Sheets

FIG.5
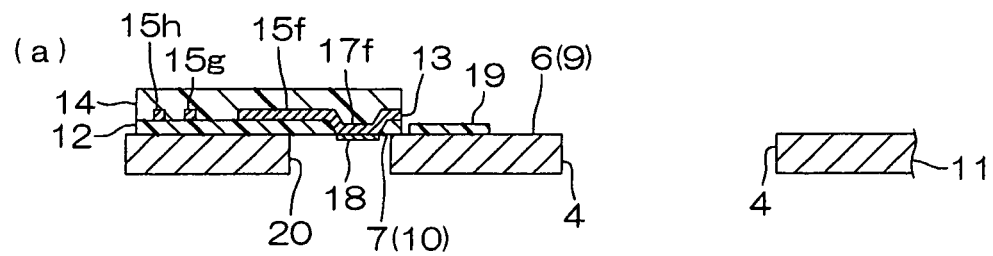
(a)
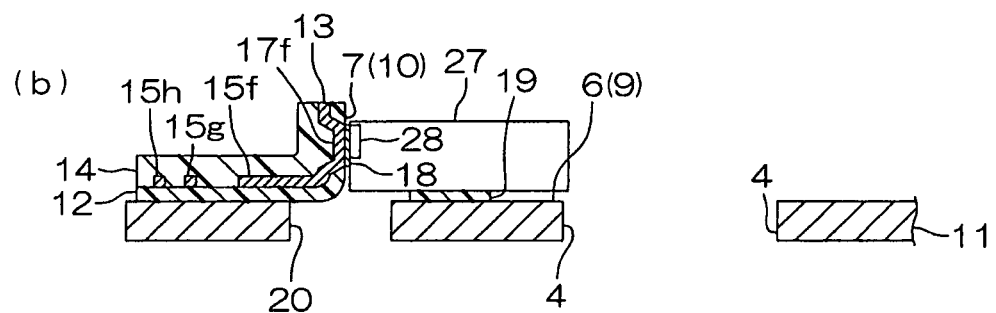
(b)

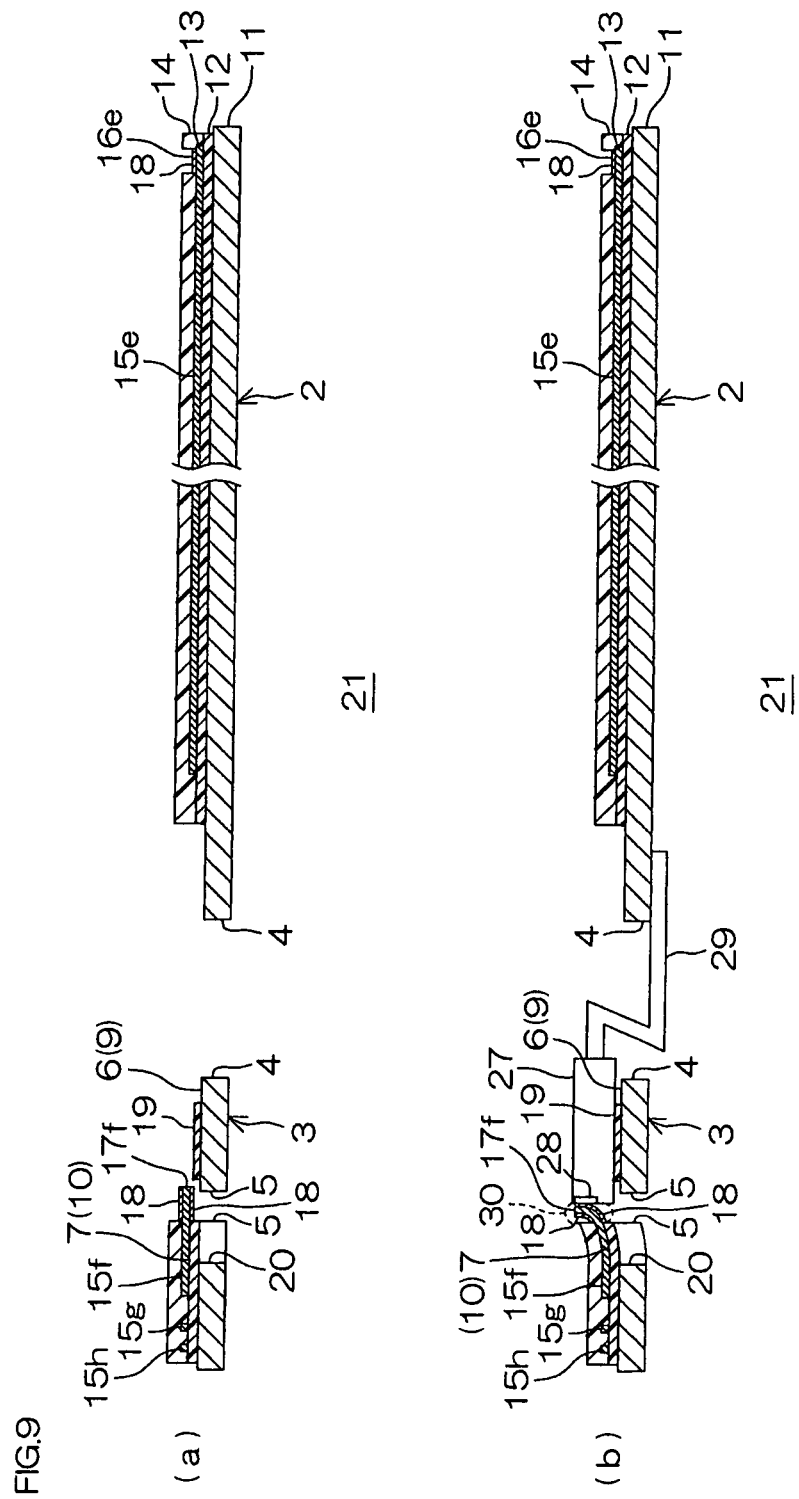

CONNECTION STRUCTURE OF ELECTRONIC COMPONENT AND WIRED CIRCUIT BOARD, WIRED CIRCUIT BOARD ASSEMBLY, AND METHOD FOR TESTING ELECTRONIC COMPONENT

CROSS-REFERENCE TO RELATED APPLICATION

The present application claims priority from U.S. Provisional Patent Application No. 61/282,060 filed on Dec. 9, 2009, and from Japanese Patent Application No. 2009-273693 filed on Dec. 1, 2009, the contents of which are hereby incorporated by reference into this application.

BACKGROUND OF THE INVENTION

1. Field of the Invention

The present invention relates to a connection structure of an electronic component and a wired circuit board, a wired circuit board assembly, and a method for testing an electronic component. To be specific, the present invention relates to a connection structure of an electronic component such as a head slider and a wired circuit board such as a suspension board with circuits; a wired circuit board assembly including the connected electronic component and wired circuit board; and a method for testing an electronic component.

2. Description of the Related Art

Conventionally, in magnetic recording on a hard disk, a head slider on which a magnetic reading device and a magnetic writing device (magnetic head) are mounted has been used.

The head slider is mounted, for example, on a suspension board with circuits. The terminal of the magnetic head mounted on the head slider is electrically connected to the conductive pattern of the suspension board with circuits, and the head slider floats, resisting to air flow generated upon relative operation of the suspension board with circuits and the hard disk, so as to maintain a small gap therebetween. Magnetic recording by the magnetic head on the hard disk is allowed in this fashion.

As a method for connecting a head slider to a conductive pattern, for example, a following method has been proposed: a conductive layer is provided on a metal substrate with an insulating layer interposed therebetween to serve as a circuit pattern; an end face of the patterning end portion of the circuit pattern is formed to coincide with the end face of the insulating layer, or formed to be projected toward a distal end direction over the end face of the insulating layer; and the patterning end portion and the terminal of the magnetic head are electrically connected with a solder ball (for example, see Japanese Unexamined Patent Publication No. 2006-120288).

Meanwhile, recently, there has been a demand for such a hard disk that floating characteristics of the head slider be retained, and the storage capacity of hard disks be increased. Therefore, a high density hard disk drive is required, i.e., more terminals are included in the head slider without increasing the size of the head slider.

Defective products are generated sometimes in production steps of a head slider that is compatible with a high density hard disk drive. Therefore, in production of head sliders, usually, electrical characteristics and floating characteristics of head sliders are tested, and non-defective products are sorted out from defective products.

As an example of such testing of head sliders, a method of testing a head slider has been proposed (for example, see Japanese Unexamined Patent Publication No. 2007-128634).

In this method, a test head suspension assembly including a slider, a suspension having a suspension trace, and a supporting structure that supports the slider is prepared; the slider and the suspension trace are directly connected with solder and the like; and electrical characteristics and floating characteristics are tested.

In the method described in Japanese Unexamined Patent Publication No. 2007-128634, the solder used for the connection of the slider and the suspension trace is re-melted and removed; and then the slider is taken out from the test head suspension assembly.

Then, those sliders determined to be defective products in the testing are discarded by themselves without being mounted on a suspension board with circuits, while only those sliders determined to be non-defective products are mounted on a suspension board with circuits.

SUMMARY OF THE INVENTION

However, in a head slider designed for a high density hard disk drive, spacing between the terminals is narrow. Then, when the patterning end portion of the conductive layer and the terminal of the magnetic head are connected with a solder ball as described in Japanese Unexamined Patent Publication No. 2006-120288, the solder ball swells and bulges out between the terminals, sometimes generating a short circuit.

On the other hand, for example, when the volume of the solder ball is reduced to suppress the swelling and bulging of the solder ball, there is a disadvantage in that the connection strength between the patterning end portion of the conductive layer and the terminal of the magnetic head is reduced.

Thus, in hard disk drives, what is sought after is a connection structure in which a short circuit between terminals is prevented and the suspension board with circuits and the head slider are connected with excellent connection reliability even if the terminals are arranged with narrow spacing.

Also, with the method described in Japanese Unexamined Patent Publication No. 2007-128634, because it is usually difficult to completely re-melt and remove the solder, residual solder may be present at the terminal of the slider that was taken out from the test head suspension assembly (that is, the terminal is contaminated).

In such a case, the residual solder at the terminal of the slider may hinder the mounting of the slider on a suspension board with circuits, and may cause a defective product.

Also, with the method described in Japanese Unexamined Patent Publication No. 2007-128634, there is a need for a step of connecting the slider and the suspension trace with solder, and a step of re-melting and removing the solder, and therefore there are disadvantages in that it involves a number of steps and is time-consuming in the production of sliders.

An object of the present invention is to provide a connection structure of an electronic component and a wired circuit board in which excellent connection reliability is ensured easily and reliably, a short circuit between terminals is prevented, and further contamination of terminals is prevented; a wired circuit board assembly: and a method for testing an electronic component.

A connection structure of an electronic component and a wired circuit board of the present invention includes the electronic component including a plurality of external terminals, and the wired circuit board including a metal supporting board, an insulating base layer formed on the metal supporting board, and a conductive pattern formed on the insulating base layer, the conductive pattern including a plurality of terminal portions for connection with the plurality of external terminals, wherein the electronic component and the wired circuit board are disposed such that the plurality of external terminals and the plurality of terminal portions face each other, the wired circuit board is bent so that the conductive pattern is warped, and by reaction force of the warping, the plurality of terminal portions and the plurality of external terminals are abutted, and the electronic component and the wired circuit board are electrically connected.

In such a connection structure of an electronic component and a wired circuit board, the terminal portions and the external terminals are abutted by the reaction force of warping of the wired circuit board, and therefore swelling and bulging of solder are suppressed by reducing the volume of the solder for their connection, and at the same time, excellent connection between the electronic component and the wired circuit board is allowed.

Therefore, in such a connection structure of an electronic component and a wired circuit board, even in the case of a high density hard disk drive and narrow terminal spacing, excellent connection reliability is ensured, and a short circuit between the terminal portions and the external terminals can be prevented.

Furthermore, in such a connection structure of an electronic component and a wired circuit board, by only abutting the terminal portions and the external terminals, the electronic component and the wired circuit board can be connected, and in such a case, connection by solder is unnecessary.

Therefore, with such a connection structure of an electronic component and a wired circuit board, even when the electronic component is taken out from the wired circuit board, re-melting and removal of solder is unnecessary, and therefore man-hour that is necessary for taking out the electronic component is reduced, and contamination of the external terminal by solder can be prevented.

In the connection structure of an electronic component and a wired circuit board of the present invention, it is preferable that by the spring force of the metal supporting board, the plurality of terminal portions are abutted on the plurality of external terminals.

In such a connection structure of an electronic component and a wired circuit board, the wired circuit board is warped against the spring force of the metal supporting board, and the terminal portions of the conductive pattern are abutted on the external terminals of the electronic component by the spring force of the metal supporting board.

Therefore, with such a connection structure of an electronic component and a wired circuit board, the terminal portions of the conductive pattern and the external terminals of the electronic component are abutted more easily and reliably, and the electronic component and the wired circuit board can be electrically connected.

It is preferable that, in the connection structure of an electronic component and a wired circuit board of the present invention, the plurality of terminal portions are arranged along the width direction that is perpendicular to the longitudinal direction of the metal supporting board with a space provided therebetween, and the metal supporting board is disposed so as to sandwich the plurality of terminal portions in the width direction.

With such a connection structure of an electronic component and a wired circuit board, the terminal portions of the conductive pattern are disposed so as to be sandwiched by the metal supporting board in the width direction, and therefore the terminal portions are allowed to be abutted on the external terminals of the electronic component more reliably by the spring force of the metal supporting board.

A wired circuit board assembly of the present invention includes an electronic component and a wired circuit board, wherein the electronic component includes a plurality of external terminals; the wired circuit board includes a metal supporting board, an insulating base layer formed on the metal supporting board, and a conductive pattern formed on the insulating base layer; the conductive pattern includes a plurality of terminal portions for connection with the plurality of external terminals; the electronic component and the wired circuit board are disposed such that the plurality of external terminals and the plurality of terminal portions face each other; the wired circuit board is bent so that the conductive pattern is warped, and by the reaction force of the warping, the plurality of terminal portions and the plurality of external terminals are abutted; and the electronic component and the wired circuit board are electrically connected.

In such a wired circuit board assembly, by the reaction force of the warping of the wired circuit board, the terminal portions and the external terminals are abutted, and therefore by reducing the solder volume for connection, swelling and bulging of the solder is suppressed, and at the same time, the electronic component and the wired circuit board are excellently connected.

Therefore, in such a wired circuit board assembly, even in the case of a high density hard disk drive and narrow terminal spacing, excellent connection reliability is ensured, and a short circuit between the terminal portions and the external terminals can be prevented.

Furthermore, in such a wired circuit board assembly, by only abutting the terminal portions and the external terminals, the electronic component and the wired circuit board can be connected, and in such a case, connection by solder is unnecessary.

Therefore, with such a wired circuit board assembly, even when the electronic component is taken out from the wired circuit board, re-melting and removal of solder is unnecessary, and therefore man-hour that is necessary for taking out the electronic component is reduced, and contamination of the external terminal by solder can be prevented.

A method for testing an electronic component of the present invention includes the steps of: preparing an electronic component including a plurality of external terminals; preparing a wired circuit board including a metal supporting board, an insulating base layer formed on the metal supporting board, and a conductive pattern formed on the insulating base layer, the conductive pattern including a plurality of terminal portions for connection with the plurality of external terminals; disposing the electronic component and the wired circuit board so that the plurality of external terminals and the plurality of terminal portions face each other; bending the wired circuit board so that the conductive pattern is warped; allowing the plurality of terminal portions and the plurality of external terminals to be abutted by the reaction force of the warping; and testing electrical characteristics of the electronic component through the wired circuit board.

In such a method for testing an electronic component, the terminal portions and the external terminals are abutted by the reaction force of warping of the wired circuit board, and therefore connection by solder is unnecessary.

Therefore, with such a method for testing an electronic component, even when the electronic component is taken out from the wired circuit board, re-melting and removal of solder is unnecessary, and therefore man-hour that is necessary for taking out the electronic component is reduced, and contamination of the external terminal by solder can be prevented. Therefore, after testing the electronic component, the electronic component can be taken out excellently, and can be mounted on another wired circuit board.

In a method for connecting an electronic component with a wired circuit board, the electronic component includes a plurality of external terminals, and the wired circuit board includes a metal supporting board, an insulating base layer formed on the metal supporting board, and a conductive pattern formed on the insulating base layer, the conductive pattern including a plurality of terminal portions for connection with the plurality of external terminals, and the method includes the steps of: disposing the electronic component and the wired circuit board such that the plurality of external terminals and the plurality of terminal portions face each other, and bending the wired circuit board so that the conductive pattern is warped, and allowing the plurality of terminal portions and the plurality of external terminals to be abutted by reaction force of the warping, thereby electrically connecting the electronic component with the wired circuit board.

BRIEF DESCRIPTION OF THE DRAWINGS

FIG. 5 shows cross-sectional views illustrating a connection structure of a head slider and a suspension board with circuits as another embodiment (embodiment in which a magnetic head-side connection terminal portion is formed so as to be embedded in an insulating base layer) of the connection structure (method) of an electronic component and a wired circuit board of the present invention: (a) illustrating a cross-sectional view of a relevant part of the suspension board with circuits before connecting a head slider; and (b) illustrating a cross-sectional view of a relevant part of the suspension board with circuits after connecting a head slider.

FIG. 9 shows cross-sectional views illustrating a method for testing a head slider as an embodiment of a method for testing an electronic component of the present invention: (a) illustrating a cross-sectional view of a substrate for testing before connecting a head slider, and (b) illustrating a cross-sectional view of a substrate for testing after connecting a head slider.

DETAILED DESCRIPTION OF THE INVENTION

Figure 1:
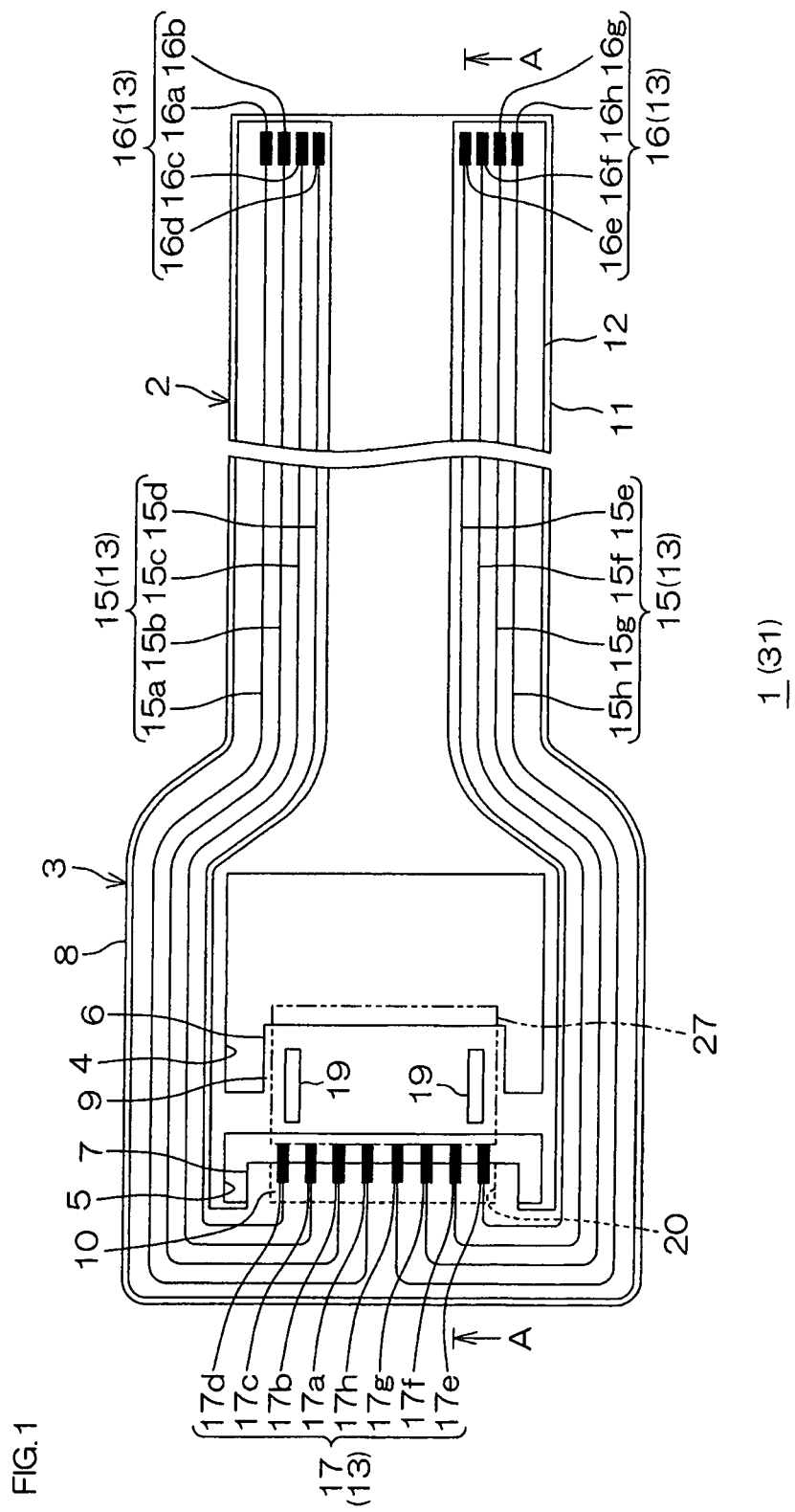
FIG. 1 shows a plan view of a suspension board with circuits that is used in a connection structure of a head slider and a suspension board with circuits as an embodiment of a connection structure (method) of an electronic component and a wired circuit board of the present invention.
Figure 2:
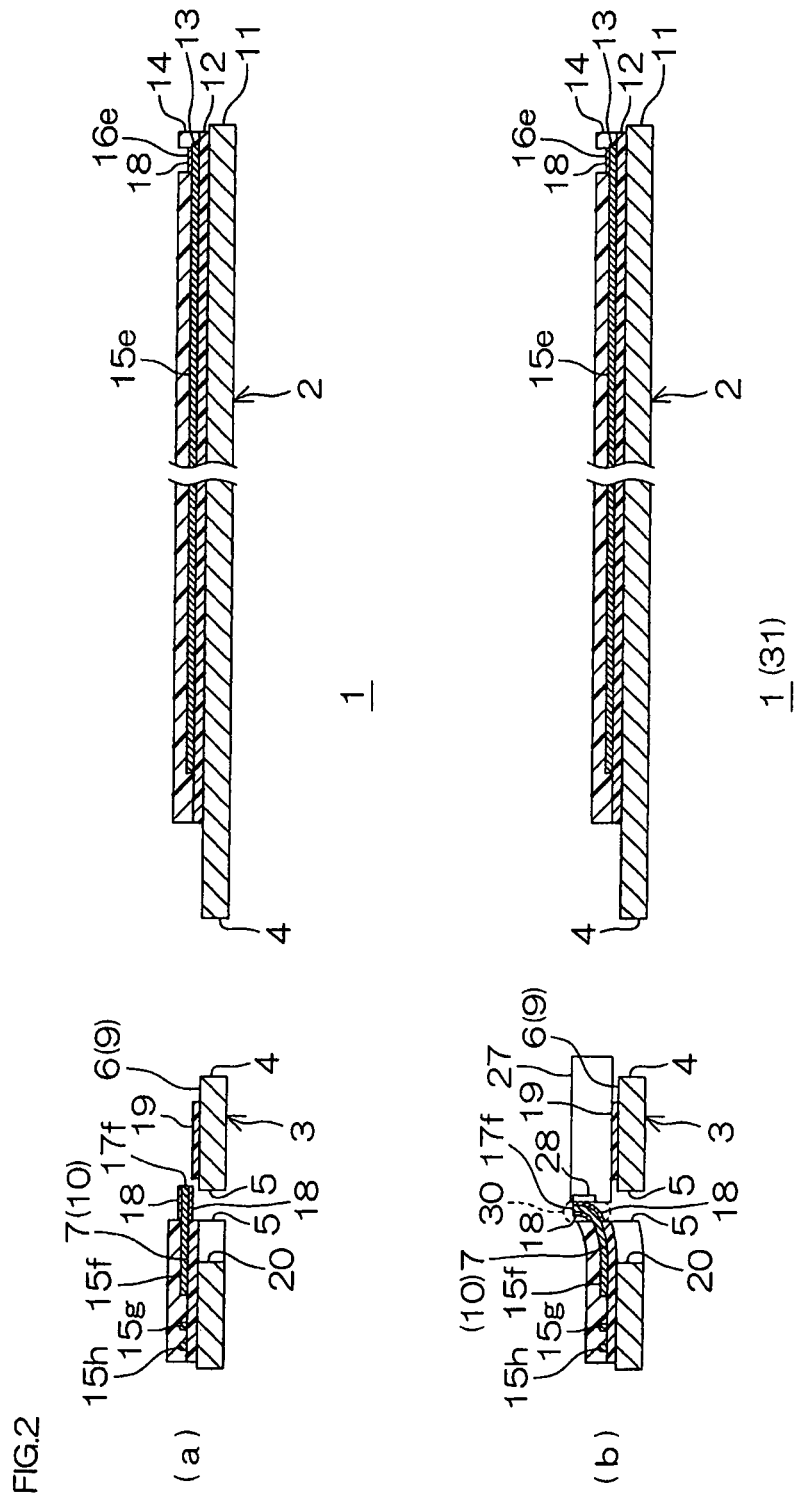
FIG. 2 shows cross-sectional views illustrating a connection structure of a head slider and a suspension board with circuits as an embodiment of a connection structure (method) of an electronic component and a wired circuit board of the present invention: (a) illustrating a cross-sectional view taken along line A-A of the suspension board with circuits shown in FIG. 1 before connecting a head slider; and (b) illustrating a cross-sectional view taken along line A-A of the suspension board with circuits shown in FIG. 1 after connecting a head slider.

FIG. 1 shows a plan view of a suspension board with circuits that is used in a connection structure of a head slider and a suspension board with circuits as an embodiment of a connection structure of an electronic component and a wired circuit board of the present invention; FIG. 2 shows cross-sectional views illustrating a connection structure of a head slider and a suspension board with circuits as an embodiment of a connection structure of an electronic component and a wired circuit board of the present invention: (a) illustrating a cross-sectional view taken along line A-A of the suspension board with circuits shown in FIG. 1 before connecting a head slider; and (b) illustrating a cross-sectional view taken along line A-A of the suspension board with circuits shown in FIG. 1 after connecting a head slider. In FIG. 1, an insulating cover layer 14 (described later) is omitted to clearly show the relative position of the conductive pattern 13.

In FIG. 1, on a suspension board with circuits 1, a magnetic head (not shown) of a hard disk drive is mounted, and a metal supporting board 11 for supporting the magnetic head while maintaining a small gap relative to the hard disk, resisting to air flow generated upon relative operation of the magnetic head and the hard disk (not shown), is integrally formed with a conductive pattern 13 for connecting, for example, an external circuit board (not shown) such as a read/write substrate to the magnetic head.

The suspension board with circuits 1 is formed into a flat belt shape extending in the longitudinal direction, and integrally includes a wiring portion 2 disposed at one side (in the following, referred to as rear side) in the longitudinal direction, and a gimbal portion 3 disposed at the other side (in the following, referred to as front side) in the longitudinal direction of the wiring portion 2.

The wiring portion 2 is formed into a generally rectangular shape extending in the longitudinal direction when viewed from the top.

The gimbal portion 3 is formed continuously from a distal end of the wiring portion 2, and formed into a generally rectangular shape bulging toward both outer sides relative to the wiring portion 2 in the width direction (the direction perpendicular to the longitudinal direction) when viewed from the top.

The gimbal portion 3 is formed with a first opening 4 and a second opening 5.

The first opening 4 is formed as a slit having a generally U-shape opening toward the front side when viewed from the top. The second opening 5 is formed, at a front side of the first opening 4, as a slit having a generally U-shape opening toward the front side when viewed from the top, having a length in the width direction that is generally the same as that of the first opening 4, and having a length in the longitudinal direction that is shorter than that of the first opening 4.

The gimbal portion 3 integrally includes a first tongue portion 6 sandwiched between the first opening 4 in the width direction; a second tongue portion 7 sandwiched between the second opening 5 in the width direction; and an outrigger portion 8 disposed at both outer sides of the first opening 4 and the second opening 5 in the width direction and at the front side of the second tongue portion 7.

The first tongue portion 6 is formed into a generally rectangular shape when viewed from the top, and includes a head slider mounting area 9.

The head slider mounting area 9 is a region for mounting a head slider 27 as an electronic component, and is defined at a center in the width direction of the first tongue portion 6 as a generally rectangular region shorter than the head slider 27 in the front and rear directions when viewed from the top. That is, the head slider mounting area 9 is defined at the first tongue portion 6 such that when the head slider 27 is mounted, the rear end portion of the head slider 27 projects toward the first opening 4 side, and the front end portion of the head slider 27 projects toward the second opening 5 side (ref: FIG. 2 (*b*)).

In the head slider mounting area 9, pedestals 19 for supporting the head slider 27 are formed.

The pedestals 19 are formed into a generally rectangular flat plate shape when viewed from the top, and a plurality (two) of pedestals 19 are provided along the width direction of the head slider mounting area 9 with a space provided therebetween.

The second tongue portion 7 is formed into a generally rectangular shape when viewed from the top, and includes a terminal forming area 10.

The terminal forming area 10 is a region in which a magnetic head-side connection terminal portion 17 (to be specific, the front side of the magnetic head-side connection terminal portion 17) to be described later is formed, and the terminal forming area 10 is disposed at a center in the width direction of the second tongue portion 7.

Although it is to be described in detail later, in the second tongue portion 7, the metal supporting board 11 below the terminal forming area 10 is cut out into a generally rectangular shape when viewed from the top, thereby forming a cutout portion 20 (ref: broken line).

The conductive pattern 13 integrally and continuously include an external-side connection terminal portion 16, a magnetic head-side connection terminal portion 17, and a signal wiring 15 for connecting the external-side connection terminal portion 16 and the magnetic head-side connection terminal portion 17.

The signal wiring 15 is provided in a plural number (eight) along the longitudinal direction of the suspension board with circuits 1, and the plurality of the signal wirings 15 are arranged in parallel in the width direction with a space provided therebetween.

The plurality of signal wirings 15 are formed from a first wiring 15*a*, a second wiring 15*b*, a third wiring 15*c*, a fourth wiring 15*d*, a fifth wiring 15*e*, a sixth wiring 15*f*, a seventh wiring 15*g*, and an eighth wiring 15*h*, and these first wiring 15*a*, second wiring 15*b*, third wiring 15*c*, fourth wiring 15*d*, fifth wiring 15*e*, sixth wiring 15*f*, seventh wiring 15*g*, and eighth wiring 15*h* are arranged sequentially from one side in the width direction to the other side in the width direction.

To be more specific, in the wiring portion 2, the first wiring 15*a*, second wiring 15*b*, third wiring 15*c*, fourth wiring 15*d*, fifth wiring 15*e*, sixth wiring 15*f*, seventh wiring 15*g*, and eighth wiring 15*h* are formed so as to extend in parallel to each other.

In the gimbal portion 3, the first wiring 15*a*, second wiring 15*b*, third wiring 15*c*, and fourth wiring 15*d* are disposed at the outrigger portion 8 at one outer side in the width direction of the first opening 4 and the second opening 5, and the fifth wiring 15*e*, sixth wiring 15*f*, seventh wiring 15*g*, and eighth wiring 15*h* are disposed at the outrigger portion 8 at the other outer side in the width direction of the first opening 4 and the second opening 5.

The first wiring 15*a*, second wiring 15*b*, third wiring 15*c*, fourth wiring 15*d*, fifth wiring 15*e*, sixth wiring 15*f*, seventh wiring 15*g*, and eighth wiring 15*h* are arranged such that after they reach the front end portion of the outrigger portion 8 at the front side; they extend toward inside in the width direction in the outrigger portion 8 at the front side; further, they turn back toward the rear side in the longitudinal direction in the outrigger portion 8 at the front side; and they reach the front end portion of the magnetic head-side connection terminal portion 17.

The external-side connection terminal portion 16 is disposed at the rear end portion of the wiring portion 2, and the external-side connection terminal portion 16 is provided in a plural number (eight) so as to allow the rear end portion of the respective signal wirings 15 to be connected thereto. The external-side connection terminal portions 16 are disposed in the width direction with a space provided therebetween. At the external-side connection terminal portion 16, a first external-side connection terminal portion 16*a*, a second external-side connection terminal portion 16*b*, a third external-side connection terminal portion 16*c*, a fourth external-side connection terminal portion 16*d*, a fifth external-side connection terminal portion 16*e*, a sixth external-side connection terminal portion 16*f*, a seventh external-side connection terminal portion 16*g*, and an eighth external-side connection terminal portion 16*h* are arranged sequentially from one side in the width direction toward the other side in the width direction in correspondence with the first wiring 15*a*, the second wiring 15*b*, the third wiring 15*c*, the fourth wiring 15*d*, the fifth wiring 15*e*, the sixth wiring 15*f*, the seventh wiring 15*g*, and the eighth wiring 15*h*, to be connected to the external-side connection terminal portion 16. To the external-side connection terminal portion 16, a terminal portion of an external circuit board is connected, although not shown.

The magnetic head-side connection terminal portion 17 is a terminal portion for connecting a plurality of external terminals 28 (ref: FIG. 2 (*b*)) provided in the head slider 27, and is disposed at the terminal forming area 10.

A plurality (eight) of such magnetic head-side connection terminal portions 17 are disposed in parallel in the width direction (the width direction perpendicular to the longitudinal direction of the metal supporting board 11) with a space provided therebetween so that the front end portion of the respective signal wirings 15 is connected thereto.

To be more specific, the magnetic head-side connection terminal portions 17 are disposed with a space provided therebetween in the width direction in the terminal forming area 10 so that the rear end portion thereof projects toward the second opening 5 side (that is, as a cantilevered terminal with the front side thereof supported). At the magnetic head-side connection terminal portion 17, a first magnetic head-side connection terminal portion 17a, a second magnetic head-side connection terminal portion 17b, a third magnetic head-side connection terminal portion 17c, a fourth magnetic head-side connection terminal portion 17d, a fifth magnetic head-side connection terminal portion 17e, a sixth magnetic head-side connection terminal portion 17f, a seventh magnetic head-side connection terminal portion 17g, and an eighth magnetic head-side connection terminal portion 17h are arranged sequentially with a space provided therebetween in the width direction in correspondence with the first wiring 15a, the second wiring 15b, the third wiring 15c, the fourth wiring 15d, the fifth wiring 15e, the sixth wiring 15f, the seventh wiring 15g, and the eighth wiring 15h connected thereto.

In the second tongue portion 7, the metal supporting board 11 below the terminal forming area 10 is cut out into a generally rectangular shape when viewed from the top, thereby forming a cut-out portion 20 in the metal supporting board 11. With this cut-out portion 20, the metal supporting board 11 is formed into a U-shape so as to sandwich these plurality of magnetic head-side connection terminal portions 17 in the width direction at the inner side in the width direction of the second opening 5 (ref: broken line).

On the external face of the magnetic head-side connection terminal portion 17 (front face, side face, and reverse face) a metal plating layer 18 is formed as necessary, and although it is to be described in detail later, the magnetic head-side connection terminal portion 17 and the external terminal 28 of the head slider 27 (ref: FIG. 2 (b)) are connected through the metal plating layer 18.

The suspension board with circuits 1 includes, as shown in FIG. 2, a metal supporting board 11, an insulating base layer 12 formed on the metal supporting board 11, a conductive pattern 13 formed on the insulating base layer 12, and an insulating cover layer 14 formed on the surface of the insulating base layer 12 so as to cover the conductive pattern 13.

The metal supporting board 11 is formed, as shown in FIGS. 1 and 2, in line with the first opening 4, the second opening 5, the cut-out portion 20, and the outline shape of the suspension board with circuits 1.

The insulating base layer 12 is formed so as to correspond to the position where the conductive pattern 13 is formed in the wiring portion 2 and the gimbal portion 3 so that the portion corresponding to the peripheral end edge of the metal supporting board 11, the first opening 4, and the second opening 5 is exposed. To be more specific, the insulating base layer 12 is formed into a flat belt shape having a slightly shorter length than that of the metal supporting board 11 in the longitudinal direction and the width direction.

The conductive pattern 13 is disposed over the wiring portion 2 and the gimbal portion 3, and as described above, is formed as a wiring circuit pattern integrally including the external-side connection terminal portion 16, the magnetic head-side connection terminal portion 17, and the signal wiring 15.

The insulating cover layer 14 is disposed over the wiring portion 2 and the gimbal portion 3, and is disposed so as to correspond to the position where the insulating base layer 12 is formed. The insulating cover layer 14 is formed so as to expose portions corresponding to the external-side connection terminal portion 16 and the magnetic head-side connection terminal portion 17, and cover the signal wiring 15.

Figure 3:
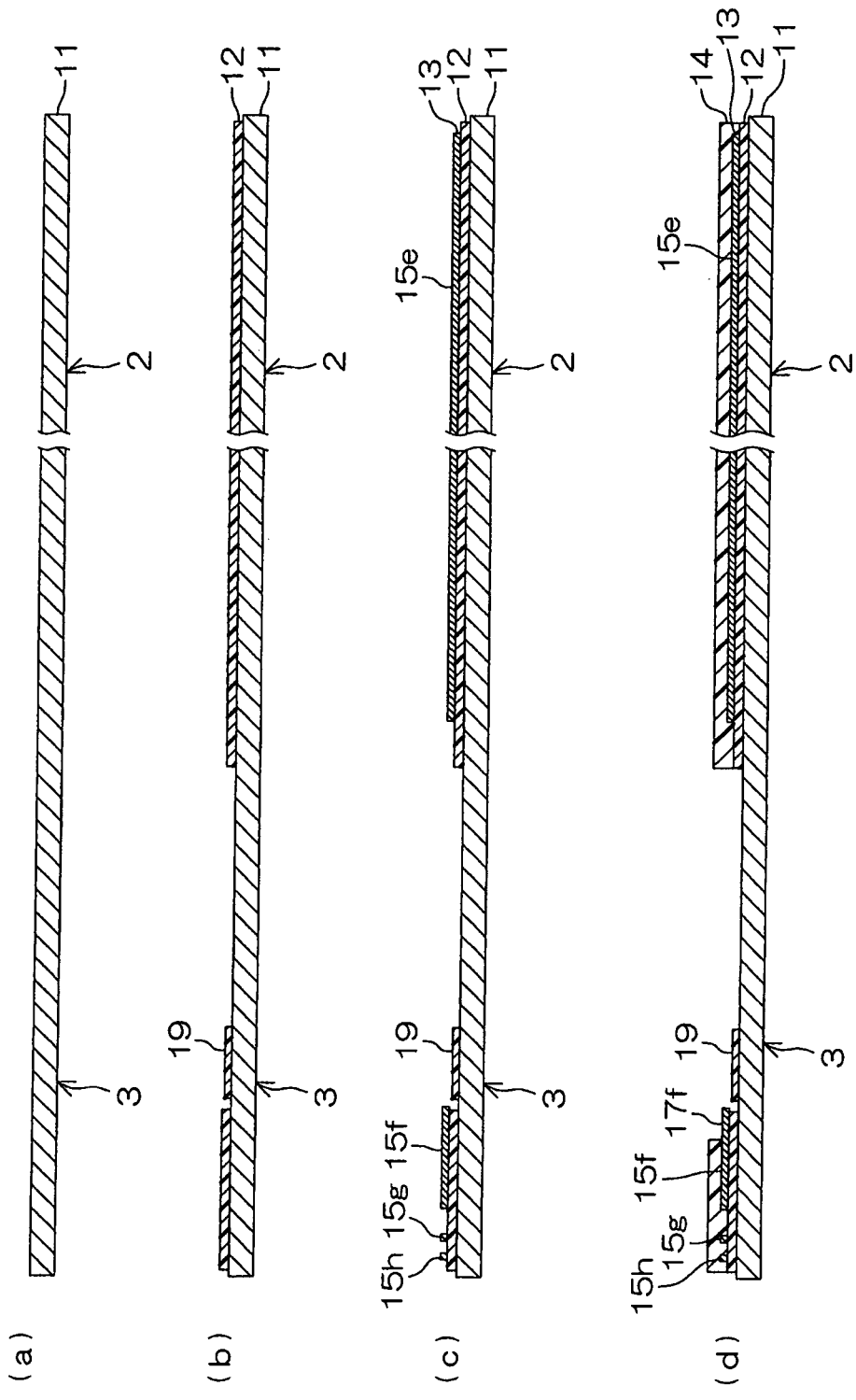
FIG. 3 is a process drawing illustrating a method for producing the suspension board with circuits shown in FIG. 2: (a) illustrating a step of preparing a metal supporting board; (b) illustrating a step of forming an insulating base layer and a pedestal; (c) illustrating a step of forming a conductive pattern; and (d) illustrating a step of forming an insulating cover layer.
Figure 4:
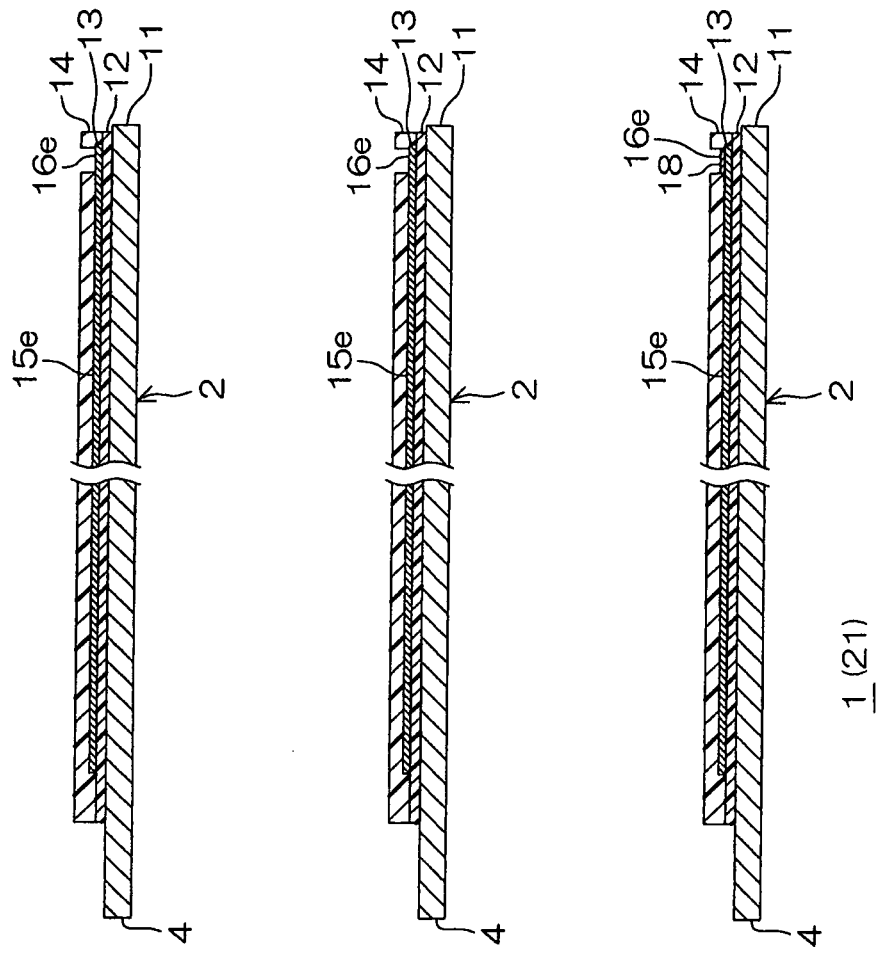
FIG. 4 is, subsequent to FIG. 3, a process drawing illustrating a method for producing the suspension board with circuits shown in FIG. 2: (e) illustrating a step of partially removing the metal supporting board; (f) illustrating a step of removing the insulating base layer in correspondence with a second opening; and (g) illustrating a step of forming a metal plating layer on the terminal portion.

FIGS. 3 and 4 are process drawings illustrating a method for producing the suspension board with circuits shown in FIG. 2.

In the following, with reference to FIGS. 3 and 4, a method for producing the suspension board with circuits 1 is described.

First, in this method, as shown in FIG. 3 (a), the metal supporting board 11 is prepared.

The metal supporting board 11 is formed from metal materials such as stainless steel, 42-alloy, aluminum, copper-beryllium, phosphor bronze, and the like. The metal supporting board 11 has a thickness of, for example, 10 to 30 μm, or preferably 15 to 25 μm.

Next, in this method, as shown in FIG. 3 (b), the insulating base layer 12 and a pedestal 19 are formed on the metal supporting board 11.

The insulating base layer 12 and the pedestal 19 are formed from, for example, insulating materials such as synthetic resins including polyimide resin, polyamide imide resin, acrylic resin, polyether nitrile resin, polyether sulfone resin, polyethylene terephthalate resin, polyethylene naphthalate resin, and polyvinyl chloride resin. The insulating base layer 12 and the pedestal 19 are preferably formed from polyimide resin.

To form the insulating base layer 12 and the pedestal 19, for example, a varnish of a photosensitive insulating material is applied on the surface of the metal supporting board 11, dried, exposed to light via a photomask, developed, and then cured as necessary.

The insulating base layer 12 and the pedestal 19 thus formed have a thickness of, for example, 1 to 35 μm, or preferably 8 to 15 μm.

The insulating base layer 12 is thus formed so as to expose the portion corresponding to the peripheral end edge of the metal supporting board 11 and the first opening 4, and to correspond to the conductive pattern 13.

Next, in this method, as shown in FIG. 3 (c), the conductive pattern 13 is formed in the above-described pattern.

The conductive pattern 13 is formed from, for example, conductive materials such as copper, nickel, tin, gold, solder, or alloys thereof.

Examples of the method for forming the conductive pattern 13 include known patterning methods such as an additive method and a subtractive method. Preferably, an additive method is used.

The conductive pattern 13 thus formed has a thickness of, for example, 3 to 50 μm, or preferably 5 to 20 μm. The signal wirings 15 have a width of, for example, 5 to 200 μm, or preferably 10 to 50 μm, and the spacing between the signal wirings 15 is, for example, 5 to 100 μm, or preferably 10 to 50 μm.

The external-side connection terminal portions 16, and the magnetic head-side connection terminal portions 17 have a width of, for example, 5 to 1000 μm, or preferably 10 to 500 μm, and the spacing between the external-side connection terminal portions 16 and the spacing between the magnetic head-side connection terminal portions 17 are, for example, 5 to 500 μm, or preferably 10 to 100 μm.

Next, in this method, as shown in FIG. 3 (d), the insulating cover layer 14 is formed in the above-described pattern.

The insulating cover layer 14 is formed from, for example, the above-described insulating materials given as examples of materials for forming the insulating base layer 12.

To form the insulating cover layer 14 in the above-described pattern, for example, a varnish of a photosensitive insulating material is applied on the surface of the metal supporting board 11 including the conductive pattern 13 and the insulating base layer 12, dried, exposed to light via a photomask, developed, and then cured as necessary.

The insulating cover layer 14 thus formed has a thickness of, for example, 1 to 40 μm, or preferably 2 to 10 μm.

The insulating cover layer 14 is thus formed as a pattern in which the portion corresponding to the external-side connection terminal portion 16 and the magnetic head-side connection terminal portion 17 is opened, and the signal wiring 15 is covered.

The insulating base layer 12, the conductive pattern 13, and the insulating cover layer 14 are laminated sequentially on the surface of the metal supporting board 11 in this manner.

Next, in this method, as shown in FIG. 4 (e), the metal supporting board 11 is partially removed. To be more specific, the portion of the metal supporting board 11 corresponding to the portion where the first opening 4, the second opening 5, and the cut-out portion 20 are formed is removed, and then the suspension board with circuits 1 is trimmed.

Examples of such processing method for the metal supporting board 11 include, but not limited to, known etching methods such as dry etching and wet etching, drill processing, and laser processing.

For example, in wet etching, first, an etching resist is formed, to correspond to an outline shape of the metal supporting board 11; on the reverse face of the metal supporting board 11 and excluding the portion where the first opening 4, second opening 5, and cut-out portion 20 are formed; and on the surface of the metal supporting board 11, the insulating base layer 12, and the insulating cover layer 14. The etching resist is formed by a known photoprocessing using a dry film photoresist, exposing the film to light, and developing the film. Thereafter, the metal supporting board 11 exposed from the etching resist is subjected to etching. The metal supporting board 11 is wet-etched by, for example, a dipping method or spray method, using an aqueous solution of ferric chloride as the etching solution. Thereafter, the etching resist is removed by a known etching method or peeling.

Next, in this method, as shown in FIG. 4 (f), a portion of the insulating base layer 12 corresponding to the second opening 5 is removed. In this way, a lower face of the conductive pattern 13 that overlaps with the second opening 5 in the thickness direction is exposed from the insulating base layer 12.

Examples of the method for removing the insulating base layer 12 include known etching methods such as dry etching and wet etching; drill processing; and laser processing.

Next, in this method, as shown in FIG. 4 (g), the metal plating layer 18 is formed on the surface of the external-side connection terminal portion 16, and the external face (front face, side face, and reverse face) of the magnetic head-side connection terminal portion 17.

Examples of a material that forms the metal plating layer 18 include metals such as gold and nickel, and examples of a method for forming the metal plating layer 18 include an electroless plating method and an electrolytic plating method. Preferably, the metal plating layer 18 made of gold is formed by electrolytic gold plating.

The suspension board with circuits 1 can be formed in this manner.

Then, the head slider 27 is mounted on the suspension board with circuits 1 that was made in such a manner, thus forming a suspension board with circuits assembly 31 as a wired circuit board assembly.

To mount the head slider 27, for example, first, an adhesive is applied on the top face of the pedestal 19 and/or the lower face of the head slider 27 in the head slider mounting area 9, and then the head slider 27 is mounted on the pedestal 19 with the adhesive so that the rear end portion of the head slider 27 is projected toward the first opening 4 side and the front end portion thereof is projected toward the second opening 5 side. Thereafter, the suspension board with circuits 1 and the head slider 27 are electrically connected.

In the following, a connection structure of the suspension board with circuits 1 and the head slider 27 is described with reference to FIG. 2.

As shown in FIG. 2 (b), the head slider 27 includes, at the front end portion thereof, a plurality of (eight) external terminals 28 to be connected to a magnetic head (not shown).

In the connection structure of the head slider 27 and the suspension board with circuits 1, the head slider 27 and the suspension board with circuits 1 are disposed, as shown in FIG. 2 (b), such that the external terminal 28 of the head slider 27 and the magnetic head-side connection terminal portion 17 of the suspension board with circuits 1 face each other.

To be more specific, the head slider 27 is mounted on the pedestal 19 so that the rear end portion of the head slider 27 projects toward the first opening 4 side and the front end portion thereof projects toward the second opening 5 side, thus allowing the external terminal 28 to project toward the second opening 5 side.

At this time, in the suspension board with circuits 1, because the magnetic head-side connection terminal portion 17 projects toward the second opening 5 side at the rear side of the terminal forming area 10, the magnetic head-side connection terminal portion 17 and the external terminal 28 face each other.

In this connection structure, the suspension board with circuits 1 is bent upward so that the conductive pattern 13 is warped, and the reaction force by the warping allows the magnetic head-side connection terminal portion 17 to be abutted on the external terminal 28. In this fashion, the magnetic head-side connection terminal portion 17 and the external terminal 28 are electrically connected.

That is, in this connection structure, a rear end portion (free end portion) of the second tongue portion 7 of the suspension board with circuits 1 is bent upward along with the magnetic head-side connection terminal portion 17 formed thereon so that the conductive pattern 13 is warped.

In this case, the magnetic head-side connection terminal portion 17 is pressed toward the rear side of the suspension board with circuits 1 by the reaction force of the warping, to be more specific, by the spring force of the metal supporting board 11 (the metal supporting board 11 sandwiching the magnetic head-side connection terminal portion 17 in the width direction).

Furthermore, in such a connection structure, the magnetic head-side connection terminal portion 17 and the external terminal 28 are connected, as necessary, by a small amount of solder (not shown).

That is, when the head slider 27 is compatible with a high density hard disk drive, if the magnetic head-side connection terminal portion 17 and the external terminal 28 are connected by solder, there may be a case where the solder swells and the bulges between the magnetic head-side connection terminal portion 17 and the external terminal 28, which may lead to occurrence of a short circuit. Therefore, in such a connection structure, when the magnetic head-side connection terminal portion 17 and the external terminal 28 are to be connected by solder, the solder volume is reduced to suppress swelling and bulging of the solder.

The head slider 27 and the suspension board with circuits 1 are electrically connected in this way, thus forming the suspension board with circuits assembly 31.

With such a connection structure of the head slider 27 and the suspension board with circuits 1, and such a suspension board with circuits assembly 31, the reaction force of the warping of the suspension board with circuits 1 allows the magnetic head-side connection terminal portion 17 and the external terminal 28 to be abutted, and therefore by reducing the volume of the solder for their connection, swelling and bulging of the solder is suppressed, and excellent connection between the head slider 27 and the suspension board with circuits 1 is achieved.

Therefore, in such a connection structure of the head slider 27 and the suspension board with circuits 1, and such a suspension board with circuits assembly 31, a high density hard disk drive is achieved, and even if spacing between the magnetic head-side connection terminal portions 17 is narrow, excellent connection reliability is ensured, and a short circuit between the magnetic head-side connection terminal portions 17 and the external terminals 28 is prevented.

Furthermore, in the connection structure of the head slider 27 and the suspension board with circuits 1, and in the suspension board with circuits assembly 31, for example, the magnetic head-side connection terminal portions 17 and the external terminals 28 can be also connected without using solder.

That is, in such a connection structure of the head slider 27 and the suspension board with circuits 1 and in such a suspension board with circuits assembly 31, the head slider 27 and the suspension board with circuits 1 can be connected also by only abutting the magnetic head-side connection terminal portions 17 and the external terminals 28, and in such a case, connection by solder is unnecessary.

Therefore, with such a connection structure of the head slider 27 and the suspension board with circuits 1, and such a suspension board with circuits assembly 31, re-melting and removal of solder is unnecessary even when the head slider 27 is to be taken out from the suspension board with circuits 1, and therefore man-hours necessary for the removal is reduced, and at the same time, contamination of the external terminal 28 by solder can be prevented.

In such a case, the portion where the magnetic head-side connection terminal portion 17 and the external terminal 28 are abutted can also be sealed as necessary, for example, with a resin 30 made from a known adhesive (ref: FIG. 2 (b)).

By sealing with the resin 30, the abutment between the magnetic head-side connection terminal portion 17 and the external terminal 28 can be maintained more reliably, and as a result, connection reliability between the suspension board with circuits 1 and the head slider 27 can be improved more.

Furthermore, in such a connection structure of the head slider 27 and the suspension board with circuits 1, the suspension board with circuits 1 is warped against the spring force of the metal supporting board 11, and the magnetic head-side connection terminal portion 17 of the conductive pattern 13 thereof is abutted on the external terminal 28 of the head slider 27 by the spring force of the metal supporting board 11.

Therefore, in such a connection structure of the head slider 27 and the suspension board with circuits 1, the head slider 27 and the suspension board with circuits 1 can be electrically connected more easily and reliably by abutting the magnetic head-side connection terminal portion 17 of the conductive pattern 13 and the external terminal 28 of the head slider 27.

Furthermore, with such a connection structure of the head slider 27 and the suspension board with circuits 1, the magnetic head-side connection terminal portion 17 of the conductive pattern 13 is disposed so as to be sandwiched by the metal supporting board 11 in the width direction, and therefore the magnetic head-side connection terminal portion 17 can be abutted on the external terminal 28 of the head slider 27 more reliably by the spring force of the metal supporting board 11.

FIG. 5 shows cross-sectional views illustrating a connection structure of a head slider and a suspension board with circuits as another embodiment (embodiment in which a magnetic head-side connection terminal portion is formed so as to be embedded in the insulating base layer) of the connection structure of an electronic component and a wired circuit board of the present invention: (a) illustrating a cross-sectional view of a relevant part of the suspension board with circuits before connecting the head slider; and (b) illustrating a cross-sectional view of a relevant part of the suspension board with circuits after connecting a head slider. In the following figures, the same reference numerals are given to those members that are the same as the above-described members, and descriptions thereof are omitted.

Although the magnetic head-side connection terminal portion 17 is formed so as to project its rear end portion toward the second opening 5 side in the description above (that is, as a cantilevered terminal), the magnetic head-side connection terminal portion 17 is not particularly limited, and for example, as shown in FIG. 5, the magnetic head-side connection terminal portion 17 can be also formed so as to be embedded in the insulating base layer 12 in the terminal forming area 10 (that is, as a simple beam terminal).

To be more specific, in this embodiment, as shown in FIG. 5 (a), the lower face of the conductive pattern 13 is partially exposed from the metal supporting board 11 and the insulating base layer 12, and the exposed conductive pattern 13 is used as the magnetic head-side connection terminal portion 17.

To form such a magnetic head-side connection terminal portion 17, for example, first, an opening extending in the thickness direction is formed in the insulating base layer 12 at a position corresponding to the magnetic head-side connection terminal portion 17, and then, the conductive pattern 13 is formed into a U-shape by a known patterning method so as to be embedded in the opening of the insulating base layer 12. Thereafter, a portion of the metal supporting board 11 that corresponds to the magnetic head-side connection terminal portion 17 is removed, and the reverse face of the conductive pattern 13 is exposed from the metal supporting board 11 and the insulating base layer 12. As necessary, the metal plating layer 18 is formed on the exposed face of the conductive pattern 13.

Because such a magnetic head-side connection terminal portion 17 is embedded in the insulating base layer 12, and its peripheral end edge is surrounded by the insulating base layer 12, it is excellent in mechanical strength. Therefore, in such an embodiment, as shown in FIG. 5 (b), in the case when the head slider 27 and the suspension board with circuits 1 are connected by abutting the magnetic head-side connection terminal portion 17 and the external terminal 28 as well, damage to the magnetic head-side connection terminal portion 17 can be decreased.

Figure 6:
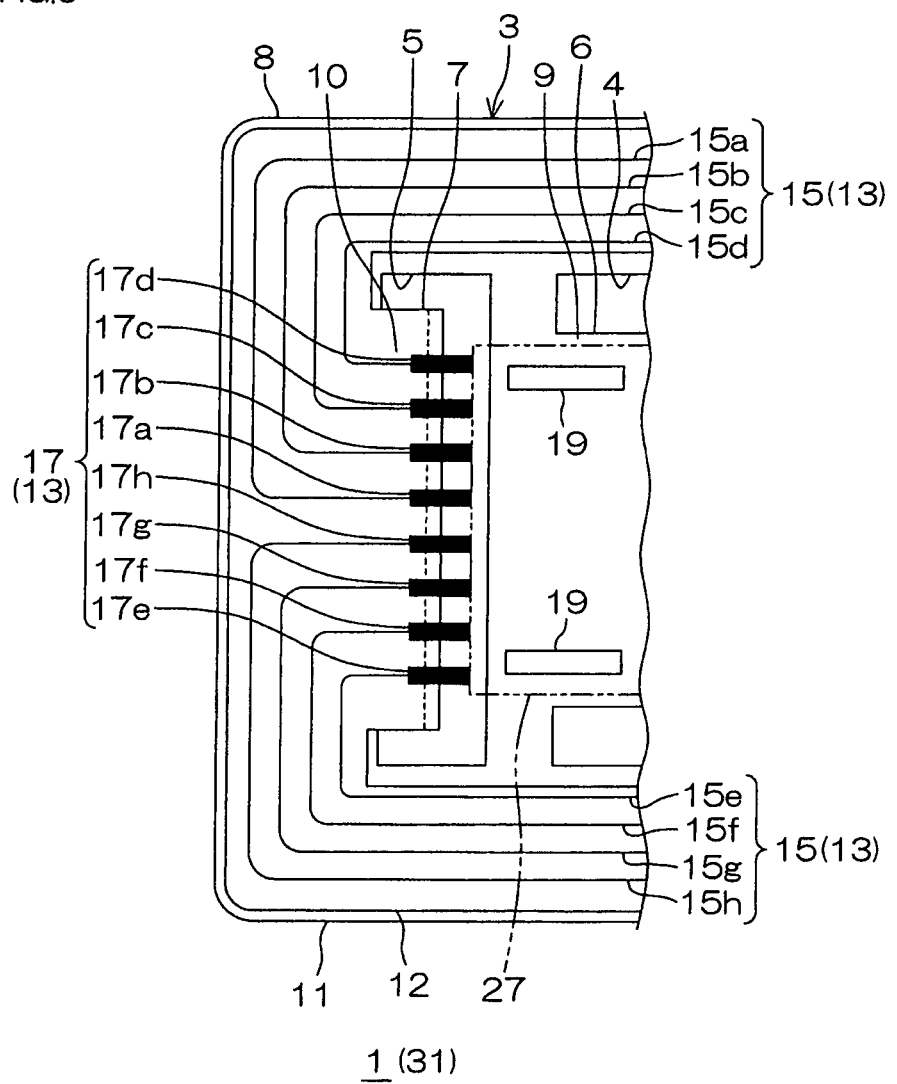
FIG. 6 shows an enlarged plan view of a relevant part of a connection structure of a head slider and a suspension board with circuits as another embodiment (embodiment in which the metal supporting board is removed at a free end side of a second tongue portion) of the connection structure (method) of an electronic component and a wired circuit board of the present invention.

FIG. 6 shows an enlarged plan view of a relevant part of a connection structure of a head slider and a suspension board with circuits as another embodiment (embodiment in which the metal supporting board is removed at a free end side of the second tongue portion) of the connection structure of an electronic component and a wired circuit board of the present invention.

Although the cut-out portion 20 is formed in the metal supporting board 11 below the terminal forming area 10 in the second tongue portion 7, and the metal supporting board 11 and the magnetic head-side connection terminal portions 17 are disposed so that the metal supporting board 11 sandwiches the plurality of magnetic head-side connection terminal portions 17 in the width direction in the description above, for example, as shown in FIG. 6, the metal supporting board 11 at the free end side (rear side) of the second tongue portion 7 can be removed without forming the cut-out portion 20.

To be more specific, in this embodiment, as shown in FIG. 6, the metal supporting board 11 at the free end side (rear side) of the second tongue portion 7 is removed (ref: broken line), and the free end edge of the metal supporting board 11 is disposed at the front side of the free end edge of the insulating base layer 12 and the insulating cover layer 14 so as to be generally parallel with the free end edge of the insulating base layer 12 and the insulating cover layer 14 when viewed from the top.

Additionally, in this embodiment, the metal supporting board 11 is formed and disposed so that the both end edges in the width direction of the metal supporting board 11 coincide with the both end edges of the insulating base layer 12 and the insulating cover layer 14 in the width direction, both surrounded by the second opening 5 in the width direction in the second tongue portion 7.

In this way, at the rear portion of the second tongue portion 7, the magnetic head-side connection terminal portion 17 is disposed so that the middle portion and the rear portion thereof do not overlap with the metal supporting board 11 in the thickness direction, and the front portion thereof overlaps with the free end portion of the metal supporting board 11 in the thickness direction.

In such an embodiment as well, the reaction force (spring force) of the warping of the suspension board with circuits 1 (to be more specific, the metal supporting board 11 overlapping with the front portion of the magnetic head-side connection terminal portion 17 in the thickness direction) allows the magnetic head-side connection terminal portion 17 and the external terminal 28 to be abutted.

Figure 7:
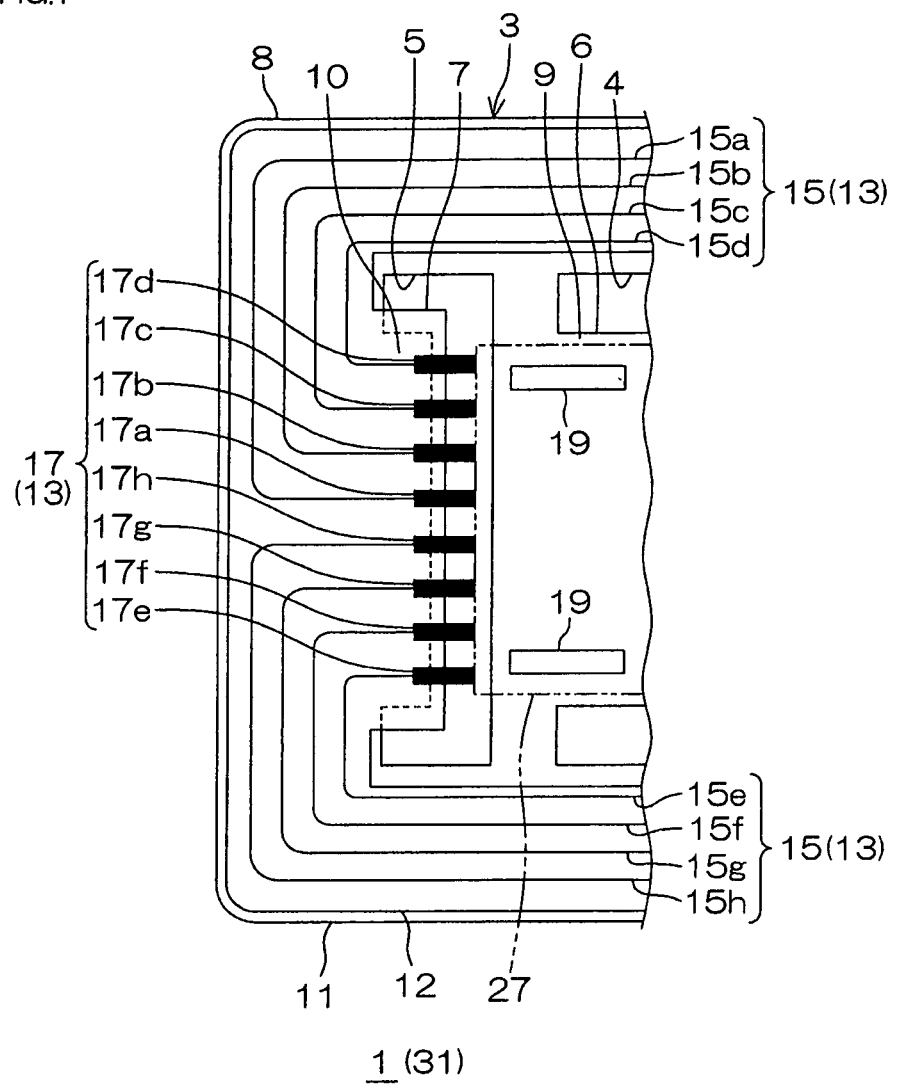
FIG. 7 shows an enlarged plan view of a relevant part of a connection structure of a head slider and a suspension board with circuits as another embodiment (embodiment in which the metal supporting board at the rear side and the both widthwise end sides of the second tongue portion is removed) of the connection structure (method) of an electronic component and a wired circuit board of the present invention.

FIG. 7 shows an enlarged plan view of a relevant part of a connection structure of a head slider and a suspension board with circuits as another embodiment (embodiment in which the metal supporting board at the rear side and the both widthwise end sides of the second tongue portion is removed) of the connection structure of an electronic component and a wired circuit board of the present invention.

Although the metal supporting board 11 is removed at the free end side (rear side) of the second tongue portion 7 while the both end edges in the width direction of the metal supporting board 11 are allowed to coincide with the both end edges in the width direction of the insulating base layer 12 and the insulating cover layer 14 (ref: FIG. 6) in the description above, for example, as shown in FIG. 7, the metal supporting board 11 can also be removed at the rear side and at both widthwise end sides of the second tongue portion 7.

To be more specific, in this embodiment, as shown in FIG. 7, as in the case of the embodiment shown in FIG. 6, the metal supporting board 11 at the free end side (rear side) of the second tongue portion 7 is removed (ref: broken line), and the free end edge of the metal supporting board 11 is disposed at the front side of the free end edge of the insulating base layer 12 and the insulating cover layer 14 so as to be generally parallel with the free end edge of the insulating base layer 12 and the insulating cover layer 14 when viewed from the top.

In addition, in this embodiment, the metal supporting board 11 is removed also at both end sides in the width direction of the second tongue portion 7 (ref: broken line), and the both end edges in the width direction of the metal supporting board 11 do not coincide with the both end edges in the width direction of the insulating base layer 12 and the insulating cover layer 14, being disposed at an inner side in the width direction than the both end edges in the width direction of the insulating base layer 12 and the insulating cover layer 14.

That is, in this embodiment, the metal supporting board 11 is formed slightly smaller than the insulating base layer 12 and the insulating cover layer 14 in the width direction and in the longitudinal direction at the second tongue portion 7.

In this embodiment as well, the magnetic head-side connection terminal portion 17 is disposed such that middle portion and rear portion of the magnetic head-side connection terminal portion 17 do not overlap with the metal supporting board 11 in the thickness direction, and the front portion of the magnetic head-side connection terminal portion 17 overlap with the free end portion of the metal supporting board 11 in the thickness direction at the rear portion of the second tongue portion 7.

In this embodiment as well, by the reaction force (spring force) of the warping of the suspension board with circuits 1 (to be more specific, the metal supporting board 11 that overlaps with the front portion of the magnetic head-side connection terminal portion 17 in the thickness direction), the magnetic head-side connection terminal portion 17 and the external terminal 28 are allowed to be abutted.

Figure 8:
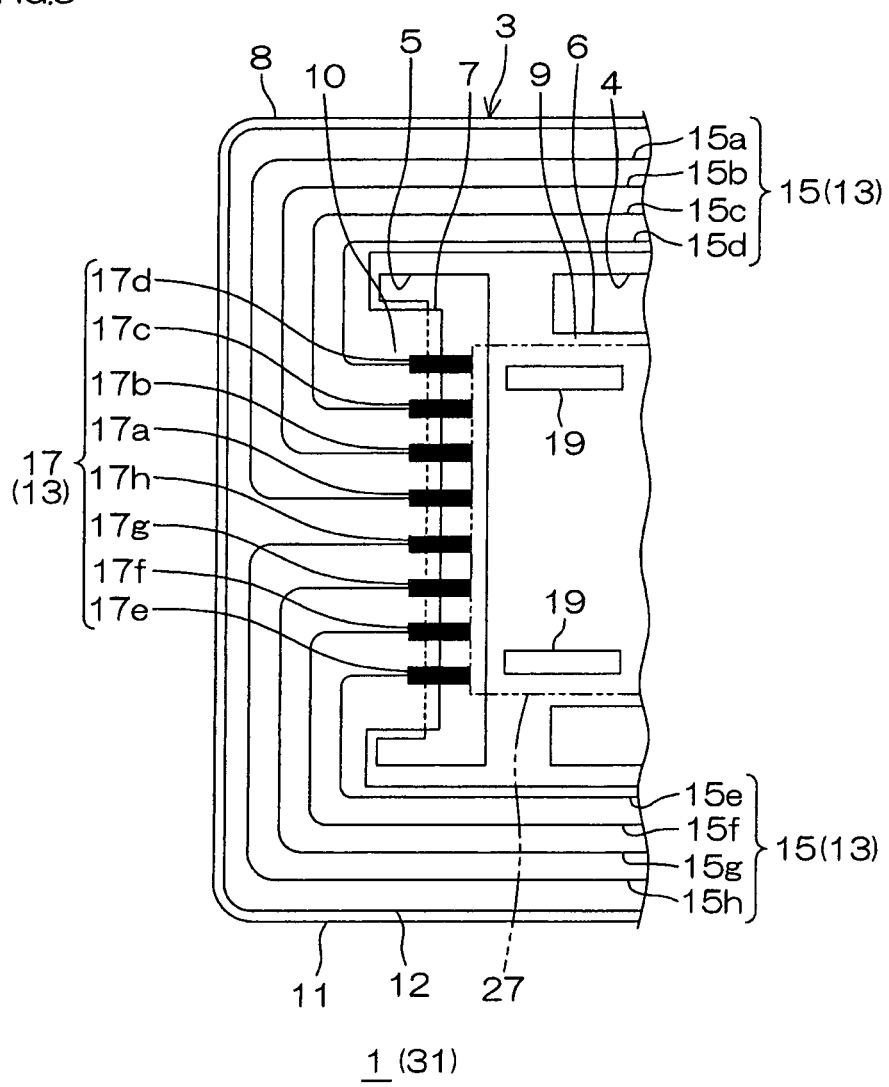
FIG. 8 shows an enlarged plan view of a relevant part of a connection structure of a head slider and a suspension board with circuits as another embodiment (embodiment in which the metal supporting board bulges toward both outer sides in the width direction over the insulating base layer and the insulating cover layer at the second tongue portion) of the connection structure (method) of an electronic component and a wired circuit board of the present invention.

FIG. 8 shows an enlarged plan view of a relevant part of a connection structure of a head slider and a suspension board with circuits as another embodiment (embodiment in which the metal supporting board bulges toward both outer sides in the width direction over the insulating base layer and the insulating cover layer at the second tongue portion) of the connection structure of an electronic component and a wired circuit board of the present invention.

Although the metal supporting board 11 is removed at the free end side (rear side) of the second tongue portion 7 while the both end edges in the width direction of the metal supporting board 11 are allowed to coincide with the both end edges in the width direction of the insulating base layer 12 and insulating cover layer 14 (ref: FIG. 6) in the description above, for example, as shown in FIG. 8, the metal supporting board 11 may also be bulged toward both outer sides in the width direction over the insulating base layer 12 and the insulating cover layer 14 at the second tongue portion 7.

To be more specific, in this embodiment, as shown in FIG. 8, the metal supporting board 11 at the free end side (rear side) of the second tongue portion 7 is removed (ref: broken line) and the free end edge of the metal supporting board 11 is disposed at a front side of the free end edge of the insulating base layer 12 and the insulating cover layer 14 so as to be generally parallel with the free end edge of the insulating base layer 12 and the insulating cover layer 14 when viewed from the top as in the embodiment shown in FIG. 6.

In addition, in this embodiment, both end edges in the width direction of the metal supporting board 11 is disposed so that the both end edges in the width direction of the metal supporting board 11 do not coincide with both end edges in the width direction of the insulating base layer 12 and the insulating cover layer 14, and the metal supporting board 11 bulges toward both outer sides in the width direction over the insulating base layer 12 and the insulating cover layer 14 at the both end sides in the width direction of the second tongue portion 7.

That is, in this embodiment, the metal supporting board 11 is formed slightly smaller in the longitudinal direction, and slightly larger in the width direction than the insulating base layer 12 and the insulating cover layer 14 at the second tongue portion 7.

In this embodiment as well, the magnetic head-side connection terminal portion 17 is disposed such that middle portion and rear portion of the magnetic head-side connection terminal portion 17 do not overlap with the metal supporting board 11 in the thickness direction, and the front portion of the magnetic head-side connection terminal portion 17 overlaps with the free end portion of the metal supporting board 11 in the thickness direction at the rear portion of the second tongue portion 7.

In this embodiment as well, by the reaction force (spring force) of the warping of the suspension board with circuits 1 (to be more specific, the metal supporting board 11 that overlaps with the front portion of the magnetic head-side connection terminal portion 17 in the thickness direction), the magnetic head-side connection terminal portion 17 and the external terminal 28 are allowed to be abutted.

It is also possible to use the above-described connection structure (ref: FIG. 2, FIG. 5, FIG. 6, FIG. 7 or FIG. 8) to test floating characteristics and electrical characteristics of the head slider 27.

That is, usually the head slider 27 is mounted on a substrate for testing and tested for its electrical characteristics and floating characteristics after its production and before being mounted on a suspension board with circuits. In such testing of the head slider 27, when the substrate for testing has the same structure as that of the above-described suspension board with circuits 1 (ref: FIG. 2, FIG. 5, FIG. 6, FIG. 7 or FIG. 8), the above-described connection structure of the head slider 27 and the suspension board with circuits 1 may be used to test the head slider 27.

FIG. 9 shows a cross-sectional view illustrating a method for testing a head slider as an embodiment of a method for testing an electronic component of the present invention: (a) illustrating a cross-sectional view of a substrate for testing before connecting a head slider, and (b) illustrating a cross-sectional view of a substrate for testing after connecting a head slider.

In the following, a method for testing the head slider 27 is described with reference to FIG. 9.

As shown in FIG. 9 (a), in this method for testing the head slider 27, first, the head slider 27 is prepared as an electronic component including a plurality of external terminals 28. Meanwhile, as a wired circuit board, the substrate for testing 21 having the same structure as the above-described suspension board with circuits 1 is prepared.

Then, in this method, the head slider 27 and the substrate for testing 21 are disposed such that the external terminal 28 of the head slider 27 and the magnetic head-side connection terminal portion 17 of the substrate for testing 21 face each other, and then the substrate for testing 21 is bent upward so as to warp the conductive pattern 13.

That is, in this testing method, the head slider 27 is mounted on the pedestal 19, and the rear end portion (free end portion) of the second tongue portion 7 of the substrate for testing 21 is bent upward so as to warp the conductive pattern 13 along with the magnetic head-side connection terminal portion 17 formed thereon, in the same manner as described above.

Next, in this method, by the reaction force of the warping, the magnetic head-side connection terminal portion 17 is allowed to be abutted on the external terminal 28.

That is, the magnetic head-side connection terminal portion 17 is pressed against the rear side of the substrate for testing 21 by the reaction force of the warping, to be more specific, the spring force of the metal supporting board 11.

In such a testing method, a head slider supporting substrate 29 for supporting the head slider 27 is provided as necessary at the rear end portion of the head slider 27.

The head slider supporting substrate 29 is formed, for example, from a metal material, into a generally rectangular flat plate shape when viewed from the top, and is bent twice at its middle portion in front and rear directions so as to be formed into a generally Z-shape when viewed in cross section. Then, the two bent portions thus formed give spring characteristics to the head slider supporting substrate 29, and by the spring force, the head slider 27 is pressed to the front side.

To be more specific, such a head slider supporting substrate 29 has a front end portion connected to the rear end portion of the head slider 27, and is inserted into the first opening 4, and the upper face of the rear end portion of the head slider supporting substrate 29 is attached to the lower face of the substrate for testing 21 (metal supporting board 11).

In this testing method, the head slider supporting substrate 29 is deformed so as to face the rear side (bent into a generally Z-shape when viewed in cross section) of the substrate for testing 21, and by the reaction force (spring force) of the deformation, the head slider 27 is pressed toward the front side. In this way, the external terminal 28 is pressed toward the front side (the magnetic head-side connection terminal portion 17 side), and the external terminal 28 and the magnetic head-side connection terminal portion 17 are abutted.

In this testing method, preferably, the head slider supporting substrate 29 is formed and disposed such that its spring force is equal to the spring force of the metal supporting board 11.

Such a head slider supporting substrate 29 is not particularly limited, and for example, is formed from a metal material and the like shown as an example of the metal supporting board 11.

In this way, the magnetic head-side connection terminal portion 17 and the external terminal 28 are abutted, and the substrate for testing 21 and the head slider 27 are electrically connected.

In such a testing method, the portion where the magnetic head-side connection terminal portion 17 and the external terminal 28 are abutted can also be sealed as necessary, for example, with a resin 30 including a known adhesive (ref: FIG. 9 (b)).

By sealing with the resin 30, the abutment between the magnetic head-side connection terminal portion 17 and the external terminal 28 can be maintained more reliably, and as a result, connection reliability between the substrate for testing 21 and the head slider 27 can be improved more.

Thereafter, although not shown, the substrate for testing 21 with the thus mounted head slider 27 is mounted on a known head slider testing machine, and a float test and an electrical test (magnetic head test) of the head slider 27 are carried out through the substrate for testing 21.

Then, when the head slider 27 is determined to be a defective product based on the test, the head slider 27 is taken out from the substrate for testing 21, and discarded alone without being mounted on a suspension board with circuits.

On the other hand, when the head slider 27 is determined to be a non-defective product, the head slider 27 is taken out from the substrate for testing 21, and mounted on the suspension board with circuits.

In such a method for testing the head slider 27, by the reaction force (spring force of the metal supporting board 11) of the warping of the substrate for testing 21, the magnetic head-side connection terminal portion 17 and the external terminal 28 are abutted, and therefore connection by solder is unnecessary.

Therefore, based on such a method for testing the head slider 27, even when the head slider 27 is to be taken out from the substrate for testing 21, re-melting and removal of the solder is unnecessary, and the man-hour necessary for taking out the substrate can be decreased, and contamination of the external terminal 28 by solder can be prevented. As a result, after testing the head slider 27, the head slider 27 can be taken out and mounted on the suspension board with circuits excellently.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A connection structure of an electronic component and a wired circuit board, the structure comprising:
   the electronic component including a plurality of external terminals, and
   the wired circuit board including a metal supporting board, an insulating base layer formed on the metal supporting board, and a conductive pattern formed on the insulating base layer, the conductive pattern including a plurality of terminal portions for connection with the plurality of external terminals,
   wherein the terminal portions are arranged in a terminal forming portion and along the width direction that is perpendicular to the longitudinal direction of the metal supporting board with a space provided therebetween,
   wherein the metal supporting board is cut out at the terminal forming portion so as to sandwich the plurality of terminal portions in the width direction,
   wherein the electronic component and the wired circuit board are disposed such that the plurality of external terminals and the plurality of terminal portions face each other,
   wherein the wired circuit board is bent so that the conductive pattern is warped, and by reaction force of the warping, the plurality of terminal portions and the plurality of external terminals are abutted, and
   wherein the electronic component and the wired circuit board are electrically connected.

2. The connection structure of an electronic component and a wired circuit board according to claim 1, wherein by the spring force of the metal supporting board, the plurality of terminal portions are abutted on the plurality of external terminals.

3. A method for testing an electronic component comprising the steps of:
   preparing an electronic component including a plurality of external terminals,
   preparing a wired circuit board including a metal supporting board, an insulating base layer formed on the metal supporting board, and a conductive pattern formed on the insulating base layer, the conductive pattern including a plurality of terminal portions for connection with the plurality of external terminals, the terminal portions being arranged in a terminal forming portion and along the width direction that is perpendicular to the longitudinal direction of the metal supporting board with a space provided therebetween, and the metal supporting board being cut out at the terminal forming portion so as to sandwich the plurality of terminal portions in the width direction,
   disposing the electronic component and the wired circuit board so that the plurality of external terminals and the plurality of terminal portions face each other,
   bending the wired circuit board so that the conductive pattern is warped,
   allowing the plurality of terminal portions and the plurality of external terminals to be abutted by the reaction force of the warping, and
   testing electrical characteristics of the electronic component through the wired circuit board.

4. A method for connecting an electronic component with a wired circuit board,
   wherein the electronic component includes a plurality of external terminals, and
   wherein the wired circuit board includes a metal supporting board, an insulating base layer formed on the metal supporting board, and a conductive pattern formed on the insulating base layer, the conductive pattern including a plurality of terminal portions for connection with the plurality of external terminals, the terminal portions being arranged in a terminal forming portion of the wired circuit board and along the width direction that is perpendicular to the longitudinal direction of the metal supporting board with a space provided therebetween, and the metal supporting board being cut out at the terminal forming portion so as to sandwich the plurality of terminal portions in the width direction,
   the method comprising the steps of:
   disposing the electronic component and the wired circuit board such that the plurality of external terminals and the plurality of terminal portions face each other, and
   bending the wired circuit board so that the conductive pattern is warped, and allowing the plurality of terminal portions and the plurality of external terminals to be abutted by reaction force of the warping, thereby electrically connecting the electronic component with the wired circuit board.

* * * * *